United States Patent
Lassalle-Balier et al.

(10) Patent No.: US 10,734,443 B2
(45) Date of Patent: Aug. 4, 2020

(54) DUAL MANETORESISTANCE ELEMENT WITH TWO DIRECTIONS OF RESPONSE TO EXTERNAL MAGNETIC FIELDS

(71) Applicant: Allegro MicroSystems, LLC, Manchester, NH (US)

(72) Inventors: Rémy Lassalle-Balier, Bures sur Yvette (FR); Paolo Campiglio, Arcueil (FR)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 16/507,538

(22) Filed: Jul. 10, 2019

(65) Prior Publication Data

US 2020/0066790 A1    Feb. 27, 2020

Related U.S. Application Data

(63) Continuation-in-part of application No. 16/113,321, filed on Aug. 27, 2018.

(51) Int. Cl.
| | |
|---|---|
| H01L 27/22 | (2006.01) |
| H01L 43/02 | (2006.01) |
| G01R 33/09 | (2006.01) |
| H01L 43/10 | (2006.01) |
| H01L 43/08 | (2006.01) |

(52) U.S. Cl.
CPC ............ *H01L 27/22* (2013.01); *G01R 33/09* (2013.01); *H01L 43/02* (2013.01); *H01L 43/08* (2013.01); *H01L 43/10* (2013.01)

(58) Field of Classification Search
CPC .......... G01R 33/09; H01L 43/02; H01F 10/32
See application file for complete search history.

(56) References Cited

U.S. PATENT DOCUMENTS

| | | | |
|---|---|---|---|
| 5,216,560 A | 6/1993 | Brug et al. | |
| 5,561,368 A | 10/1996 | Dovek et al. | |
| 6,166,539 A | 12/2000 | Dahlberg et al. | |
| 6,501,678 B1 | 12/2002 | Lenssen et al. | |
| 7,064,937 B2 | 6/2006 | Wan et al. | |
| 7,259,545 B2 | 8/2007 | Stauth et al. | |
| 7,838,133 B2 | 11/2010 | Zhang et al. | |
| 8,269,491 B2 | 9/2012 | Cummings et al. | |
| 9,046,562 B2 | 6/2015 | Cummings et al. | |
| 9,465,056 B2 | 10/2016 | Han et al. | |
| 9,812,637 B2 | 11/2017 | Fermon et al. | |

(Continued)

OTHER PUBLICATIONS

U.S. Appl. No. 16/157,317, filed Oct. 11, 2018, Lassalle-Balier et al.
(Continued)

*Primary Examiner* — Alvaro E Fortich
(74) *Attorney, Agent, or Firm* — Daly, Crowley, Mofford & Durkee, LLP

(57) ABSTRACT

A material stack includes a first magnetoresistance element with a first direction of response to an external magnetic field and a second magnetoresistance element with second direction of response to the external magnetic field, opposite to the first direction of response. The first magnetoresistance element can be disposed under or over the second magnetoresistance element. An insulating layer separates the first and second magnetoresistance elements.

33 Claims, 9 Drawing Sheets

(56) References Cited

U.S. PATENT DOCUMENTS

| | | | |
|---|---|---|---|
| 10,060,880 B2 | 8/2018 | Chen et al. | |
| 2008/0258721 A1 | 10/2008 | Guo et al. | |
| 2009/0237075 A1 | 9/2009 | Koss | |
| 2010/0007344 A1 | 1/2010 | Guo et al. | |
| 2010/0277971 A1 | 11/2010 | Slaughter et al. | |
| 2011/0062537 A1 | 3/2011 | Oh et al. | |
| 2013/0140658 A1* | 6/2013 | Yamane | H01L 43/08 257/421 |
| 2014/0250244 A1* | 9/2014 | Song | H01L 43/08 710/5 |
| 2015/0022196 A1 | 1/2015 | Hebiguchi et al. | |
| 2015/0177286 A1 | 6/2015 | Fuji et al. | |
| 2015/0333254 A1 | 11/2015 | Liu et al. | |
| 2016/0218277 A1* | 7/2016 | Yano | H01L 43/02 |
| 2016/0359103 A1 | 12/2016 | Fermon et al. | |
| 2017/0314969 A1 | 11/2017 | Ausserlechner et al. | |
| 2019/0219616 A1 | 7/2019 | Cadugan et al. | |
| 2019/0219643 A1 | 7/2019 | Cadugan et al. | |

OTHER PUBLICATIONS

U.S. Appl. No. 16/157,313, filed Oct. 11, 2018, Lassalle-Balier et al.
Allegro MicroSystems, LLC, "High Sensitivity, 1 MHz GMR-Based Current Sensor IC in Space-Saving Low Resistance QFN Package;" ACS70331; Dec. 1, 2017; 22 Pages.
Notice of Allowance dated Aug. 22, 2019 for U.S. Appl. No. 15/869,620; 11 pages.

\* cited by examiner

| | | | | | |
|---|---|---|---|---|---|
| | 705 | Cap | | | |
| free | 702 | 702b (5.0 nm) NiFe | | | |
| | | 702a (1.0 nm) CoFe | | | |
| spacer | 703 | Cu | | | |
| | 704 | (2.1 nm) | Ferro (CoFe) | | Ref Pinned |
| 734 → | 706 | Ru (0.85nm) | | Double SAF 719 | |
| reference pinned | 708 | (4.0 nm) | Ferro (CoFe) | | |
| | 710 | Ru (0.85nm) | | | |
| | 712 | (2.0 nm) | Ferro (CoFe) | | |
| reference pinning | 714 | (18.0 or 7.0 nm) Antiferro (PtMn or IrMn) | | | |
| insulator | 716 | Thick Insulator | | | |
| free | 718 | 718b (5.0 nm) NiFe | | | |
| | | 718a (1.0 nm) CoFe | | | |
| spacer | 720 | (2.3 nm) Cu | | | |
| 736 → | 722 | (2.1 nm) | Ferro (CoFe) | | Ref Pinned |
| reference pinned | 724 | Ru (0.85nm) | | SAF 717 | |
| | 726 | (2.0 nm) | Ferro (CoFe) | | |
| reference pinning | 728 | (18.0 or 7.0 nm) Antiferro (PtMn or IrMn) | | | |
| | 730 | Seed | | | |
| 732 | 732a Substrate | | | | |

701 encompasses the upper stack; 715 encompasses the lower stack.

*FIG. 7*

DUAL MANETORESISTANCE ELEMENT WITH TWO DIRECTIONS OF RESPONSE TO EXTERNAL MAGNETIC FIELDS

CROSS REFERENCE TO RELATED APPLICATIONS

This application is a Continuation-in-Part (CIP) Application of and claims the benefit of and priority to U.S. patent application Ser. No. 16/113,321 filed Aug. 27, 2018, which is incorporated herein by reference in its entirety.

FIELD

This disclosure relates to magnetoresistance elements.

BACKGROUND

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

In certain applications, magnetic field sensors include magnetoresistance elements. These elements have an electrical resistance that changes in the presence of an external magnetic field. Spin valves are a type of magnetoresistance element formed from two or more magnetic materials or layers. The simplest form of a spin valve has a reference (or magnetically fixed) layer and a free layer. The resistance of the spin valve changes as a function of the magnetic alignment of the reference and free layers. Typically, the magnetic alignment of the reference layer does not change, while the magnetic alignment of the free layer moves in response to external magnetic fields.

In some cases, a spin valve may also have a bias. The bias may be generated by one or more magnetic layers (bias layers) that are magnetically coupled to the free layer. In the absence of an external magnetic field, the bias layers may cause the magnetic alignment of the free layer to default to a predetermined alignment. The magnetic coupling between the bias layers and the free layer is relatively weak so that an external field can override the bias and realign the magnetic alignment of the free layer.

When used in a bridge arrangement with four magnetoresistance elements, it would be useful to provide two of the magnetoresistance with an opposite response to magnetic fields than the other two magnetoresistance elements.

SUMMARY

This invention provides an ability to have four magnetoresistance elements that can be arranged in a bridge, wherein two of the magnetoresistance have an opposite response to magnetic fields than the other two magnetoresistance elements.

In accordance with an example useful for understanding an aspect of the present invention, an electronic circuit includes a first magnetoresistance element. The first magnetoresistance element includes a first reference pinning layer having a first magnetic direction; a first variable-resistance layer; and a first reference pinned layer disposed between the first reference pinning layer and the first variable resistance layer and proximate to the first variable-resistance layer, the first reference pinned layer having the first magnetic direction. The electronic circuit further includes a second magnetoresistance element disposed under or over the first magnetoresistance element. The second magnetoresistance element includes a second reference pinning layer having the first magnetic direction; a second variable-resistance layer; and a second reference pinned layer disposed between the second reference pinning layer and the second variable resistance layer and proximate to the second variable-resistance layer. The second reference pinned layer has a second magnetic direction opposite to the first magnetic direction, resulting in the first and second magnetoresistance elements having opposite responses to an external magnetic field.

In accordance with an example useful for understanding another aspect of the present invention, an electronic circuit includes a first magnetoresistance element. The first magnetoresistance element includes a first single synthetic antiferromagnet (SAF) reference pinned layer structure having a first one and only one spacer layer having a material and a thickness to result in antiferromagnetic coupling across the first one and only one spacer layer. The electronic circuit further includes a second magnetoresistance element disposed under or over the first magnetoresistance element. The second magnetoresistance element includes a first double synthetic antiferromagnet (SAF) reference pinned layer structure having a first two and only two spacer layers, each having a respective material and a respective thickness to result in antiferromagnetic coupling across each one of the first two and only two spacer layers, the first signal synthetic antiferromagnet (SAF) resulting in the first magnetoresistance element having a first resistance change in a first direction and the first double synthetic antiferromagnet (SAF) resulting in the second magnetoresistance element having a second resistance change in a second direction opposite to the first direction in response to an external magnetic field. The electronic circuit further includes a first insulator layer disposed between the first and second magnetoresistance elements.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 7 is a block diagram of an illustrative dual MR element stack with a top and a bottom MR element.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a tunneling magnetoresistance (TMR) element, also known as magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
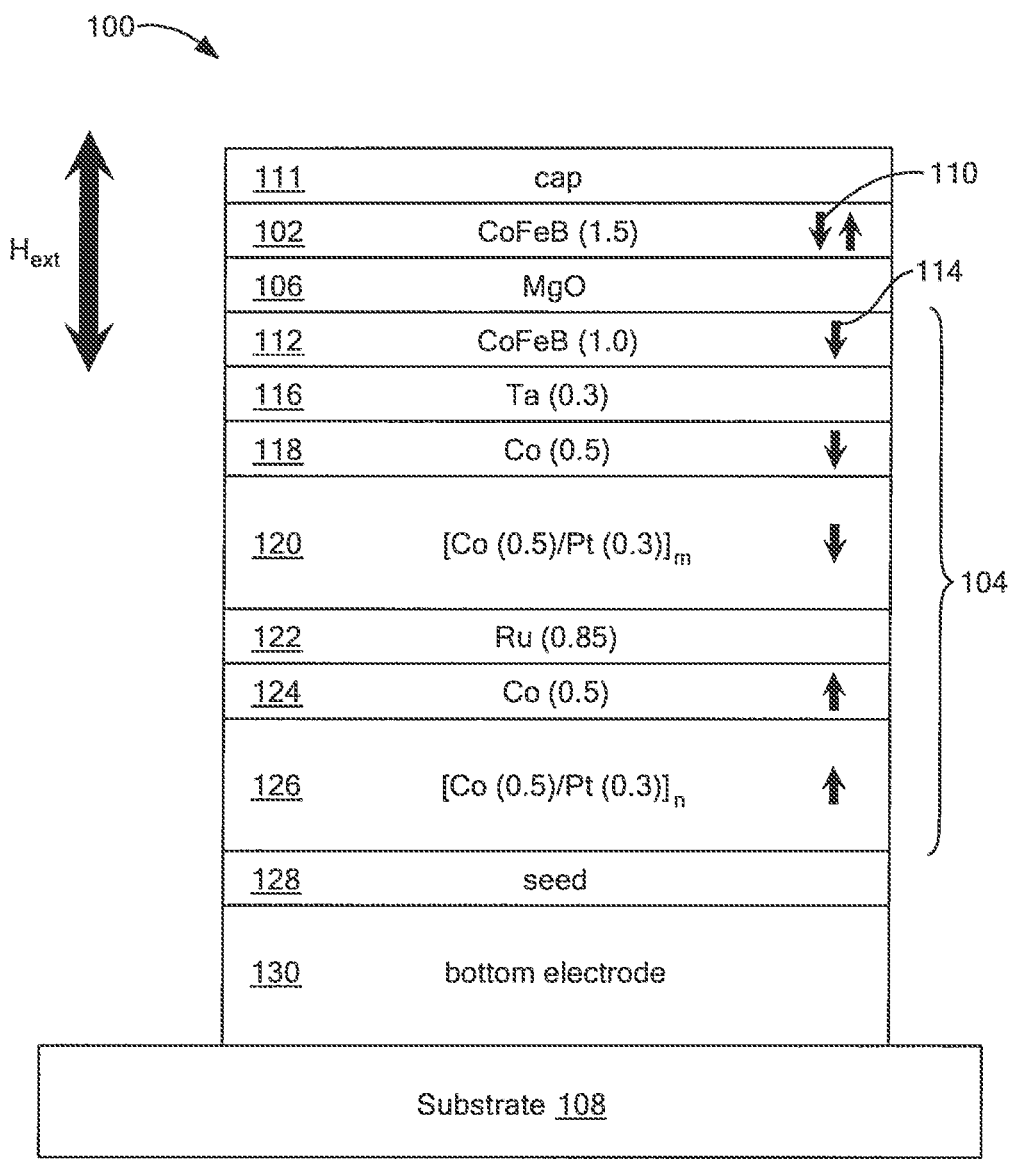
FIG. 1 is a block diagram of a single pinned perpendicular tunneling magnetoresistance (TMR) element.

FIG. 1 is a block diagram of a magnetoresistance element 100, which comprises a plurality of material layers stacked on top of one another. Each of the material layers in the stack has electrical and magnetic properties which, when placed together, cause magnetoresistance element 100 to react to external magnetic fields. Magnetoresistance element 100 is supported by substrate 108. In embodiments, substrate 108 is a semiconductor substrate that supports integrated circuits. In other embodiments, substrate 108 may be any type of material capable of supporting magnetoresistance element 100.

Magnetoresistance element 100 is a spin valve device. Thus, the electrical resistance of magnetoresistance element 100 changes as the magnetic alignment between different material layers changes.

Simple spin valves minimally have two layers: a fixed (also referred to as a reference) layer having a fixed magnetic alignment and a free layer having a magnetic alignment that changes in response to an external magnetic field. When the magnetic alignment of the free layer is lined up with the magnetic alignment of the reference layer, the electrical resistance of the spin valve has a minimal value. Conversely, when the magnetic alignment of the free layer is aligned in an opposite direction to the reference layer, the electrical resistance of the spin valve is at a maximum value. At points in between, the resistance is at an intermediate value. Generally, as the magnetic alignment of the free layer changes from one extreme (e.g. oppositely aligned with the reference layer) to the other extreme (e.g. aligned with the reference layer), the electrical resistance of the spin valve changes linearly from its maximum value to its small value.

Spin valve 100 includes a free layer 102. Instead of a reference layer, spin valve 100 has a reference stack 104 with a plurality of layers that act as a reference layer. Between free layer 102 and reference stack 104 is a spacer layer 106 that separates the free layer from the reference stack, in part so that the magnetic alignment of free layer 102 can "spin" without being influenced by the magnetic alignment of reference stack 104.

Magnetoresistance element 100 is a perpendicular tunneling magnetoresistance (TMR) element. As such, the magnetic alignment of free layer 102 is generally perpendicular to substrate 108 and can spin from a direction opposite to the substrate to a direction toward the substrate (as indicated by arrows 110). Reference stack 104 has a magnetic alignment toward substrate 108. Thus, when free layer 102 spins so its magnetic alignment points toward substrate 108, magnetoresistance element 100 has a small electrical resistance, and when free layer 102 spins so that its magnetic alignment points away from substrate 108 magnetoresistance element 100 has a maximum electrical resistance. Perpendicular alignment may be achieved by decreasing the thickness of the ferromagnetic layers. By doing so, the interface between free layer 102 and the pinned layer may override the natural magnetic direction of the free layer and cause the magnetization of the free layer to change to an out-of-plane (e.g. perpendicular) direction. This may be due to Spin Reorientation Transition effects.

Spacer layer 106 is an insulative material. Electrical current tunnels through spacer layer 106. When the magnetic directions of free layer 102 and reference stack 104 are aligned, more electrons can tunnel through free layer 106, thus the resistance is relatively low. Conversely, when the magnetic directions of free layer 102 and reference stack 104 are in opposite directions, electrons face a greater resistance to tunneling through spacer layer 106, and thus the electrical resistance of magnetoresistance element 100 is high.

In the example shown in FIG. 1, free layer 102 is a CoFeB layer and spacer layer 106 is MgO. Reference stack 104 comprises a pinned layer 112 with a fixed magnetic direction toward substrate 108 (as shown by arrow 114). Reference stack 104 also includes layers 116-126. Layers 126/112 may form a SAF arrangement. Layers 126 and 124 may form the pinned layer. Layer 122 may be the SAF spacer. Layers 120,118,116,112 may form the reference layer. Pt/Co multilayers may be used to achieve perpendicular magnetization. These may be connected through Co layers. CoFeB may be positioned close to the MgO layer to allow MgO crystallization.

Seed layer 128 is generally an electrically conductive layer on which supports the other layers of magnetoresistance element 100, and electrode 130 is a conductive electrode layer that can be used to make electrical connections to other circuits (e.g. integrated circuits supported by substrate 108).

The TMR element 100 can be driven with a current that flows between the bottom electrode 130 and the cap 111. Unlike many types of TMR elements, the TMR element 100 can be responsive to external magnetic fields in a direction of an arrow labeled Hext.

Figure 2:
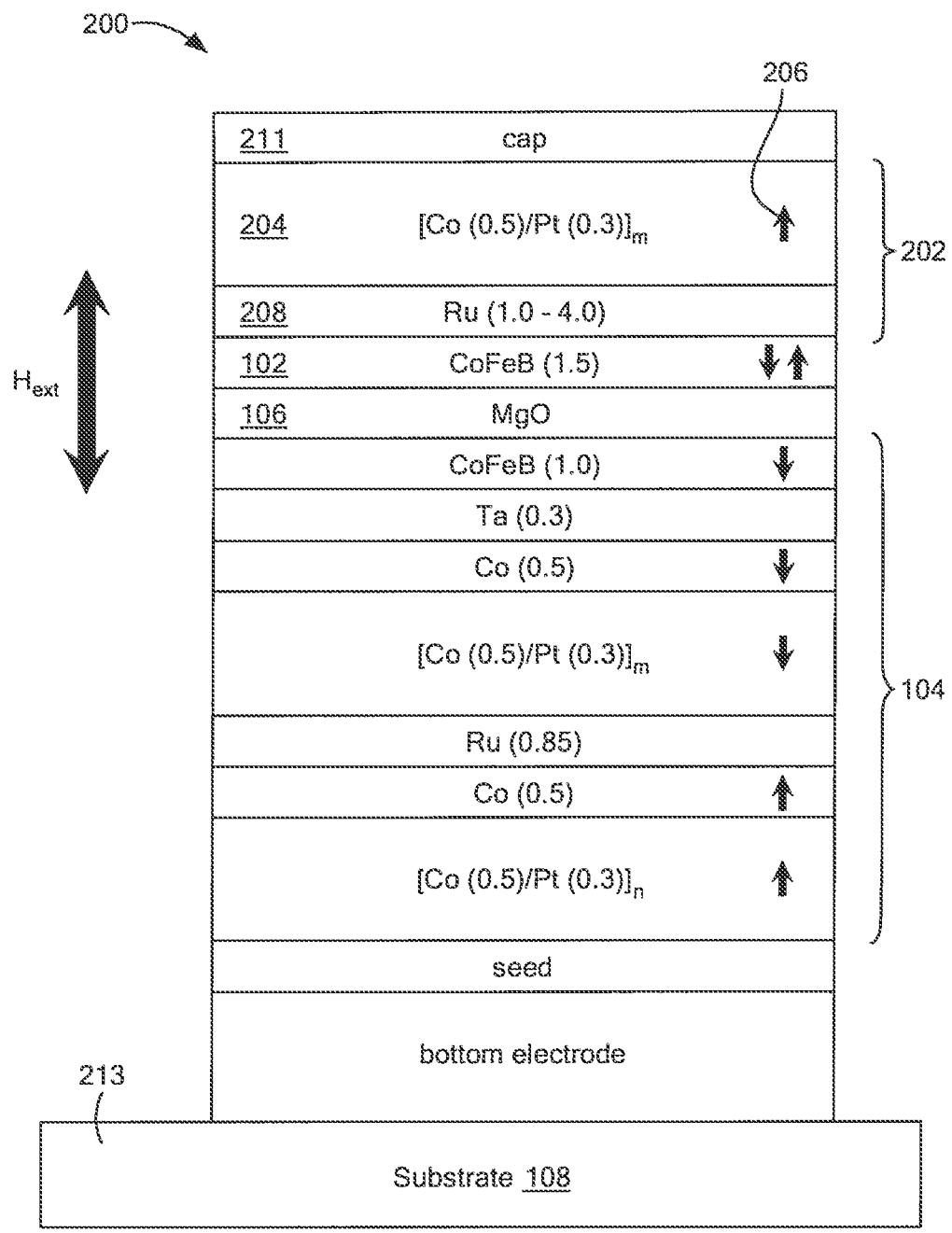
FIG. 2 is a block diagram of a double pinned perpendicular TMR element.

FIG. 2 is a block diagram of an example double pinned TMR element 200 with free layer biasing. Magnetoresistance element 200 may be similar to magnetoresistance element 100 but may also include bias stack 202. Bias stack 202 may be configured to bias free layer 102 so that, in the absence of an external magnetic field, the magnetic alignment of free layer 102 defaults to a particular direction, e.g., ninety degrees relative to the magnetic direction of the reference stack 104.

Bias stack 202 may include a ferromagnetic layer 204 having a defined magnetic direction (shown by arrow 206) perpendicular to substrate 108. Bias stack 202 may also include a non-magnetic layer 208 between ferromagnetic layer 204 and free layer 102.

Non-magnetic layer 208 may allow the ferromagnetic layer to weakly magnetically couple to the free layer 102. The weak coupling may cause free layer 102 to adopt (i.e. be biased to) a particular magnetic direction in the absence of an external magnetic field. Also, the weak coupling may allow an external magnetic field to change (i.e. "spin") the magnetic direction of free layer 102 during operation.

The TMR element 200 can be driven with a current that flows between the bottom electrode 213 and the cap 211. Unlike many types of TMR elements, the TMR element 200 can be responsive to external magnetic fields in a direction of the arrow labeled Hext, i.e. perpendicular to the top surface of substrate 108 on which TMR element 208 sits.

Figure 3:
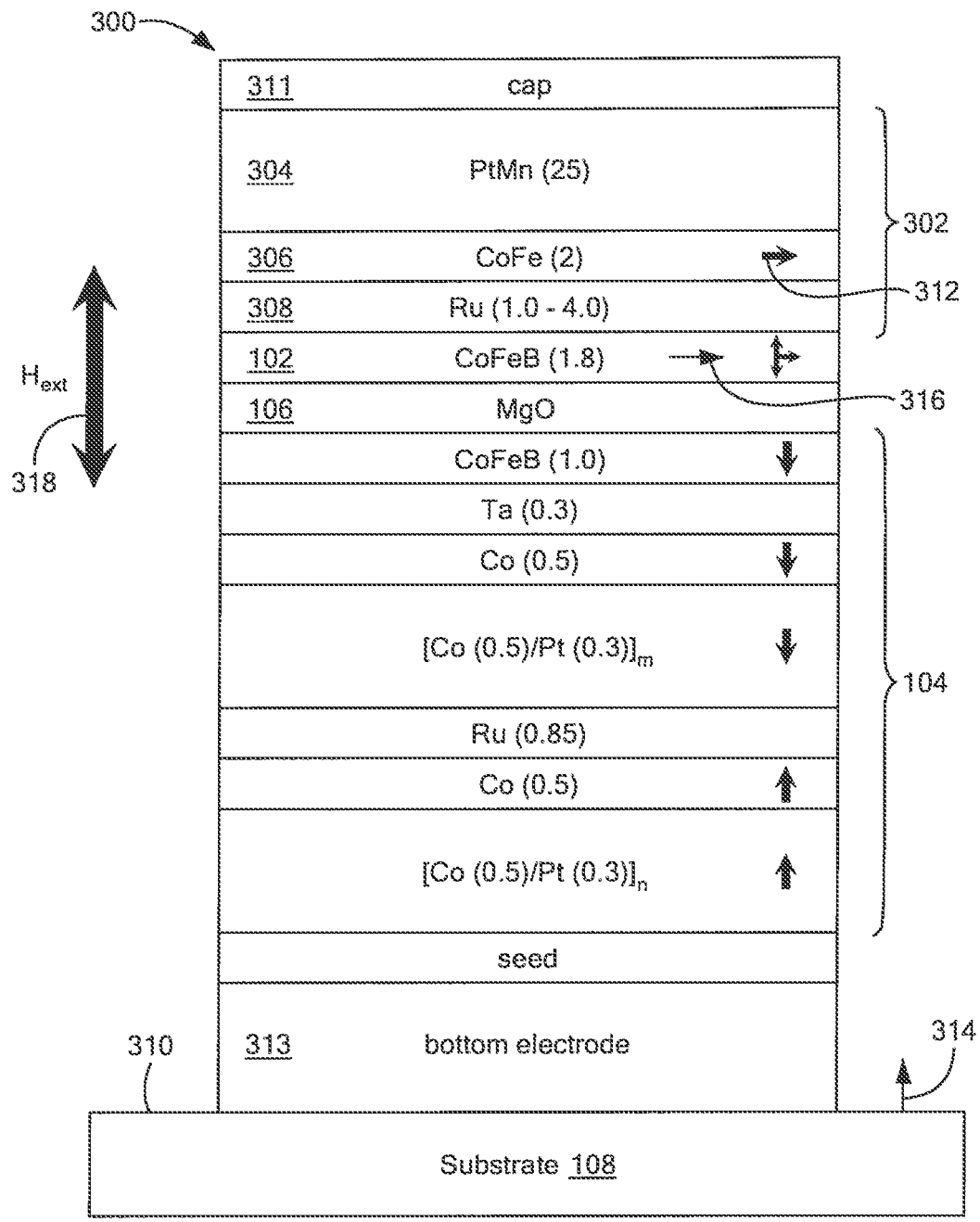
FIG. 3 is a block diagram of a double pinned perpendicular TMR element with orthogonal bias and reference directions.

Referring to FIG. 3, tunneling MR (magnetoresistance) element 300 may include free layer 102, spacer layer 106, and reference stack 104. MR element 300 may also include bias stack 302 having a pinning layer 304, a pinned layer 306, and a spacer layer 308 to allow ferromagnetic coupling between free layer 102 and pinned layer 306. In embodiments, the magnetic coupling between free layer 102 and pinned layer 306 will cause the magnetic direction of free layer 102 to default (e.g. bias) to a fixed direction in the absence of a magnetic field. In embodiments, the thickness of the free layer is relatively thick so that its magnetization will now lie in-plane. Also, the magnetic coupling may be relatively weak so that an external magnetic field can overcome the bias and change the magnetic direction of free layer 102 in response to the external magnetic field.

Surface 310 of substrate 108 (i.e. the surface on which MR element 300 is supported) may define a plane having a normal vector shown by arrow 314. The direction of magnetic alignment of pinned layer 306 may be perpendicular to normal vector 314, as shown by arrow 312. This may cause the magnetic alignment of free layer 102 to be biased in a direction perpendicular to normal vector 314 (i.e. parallel to surface 310), as shown by arrow 316. In other words, in the absence of an external magnetic field, bias stack 302 may bias the magnetic alignment of free layer 102 to a direction perpendicular to normal vector 314.

If external magnetic field 318 is present, magnetic field 318 may cause the magnetic alignment of free layer 102 to change so that, at one extreme, the magnetic alignment of free layer 102 is parallel to and in the direction of normal vector 314 (i.e. pointing away from substrate 108) and, at the other extreme, the magnetic alignment of free layer 102 is opposite to normal vector 314 (i.e. pointing toward substrate 108). As noted above, changing the magnetic alignment of free layer 102 will change the electrical resistance of MR element 300.

To provide a bias direction perpendicular to normal vector 314, bias stack 302 may be designed so that pinned layer 306 has a magnetic alignment perpendicular to normal vector 314. Inn-plane bias may be obtained by using the PtMn layer 304, which may be annealed to create one pinning direction rather than a multitude of directions.

The TMR element 300 can be driven with a current that flows between the bottom electrode 313 and the cap 311. TMR element 300 can be responsive to the amplitude of external magnetic fields in a direction of an arrow labeled Hext. The intra-stack bias may allow for a crossed anisotropy that gives a linear range at around zero field, permitting to measure the perpendicular field amplitude.

Figure 4:
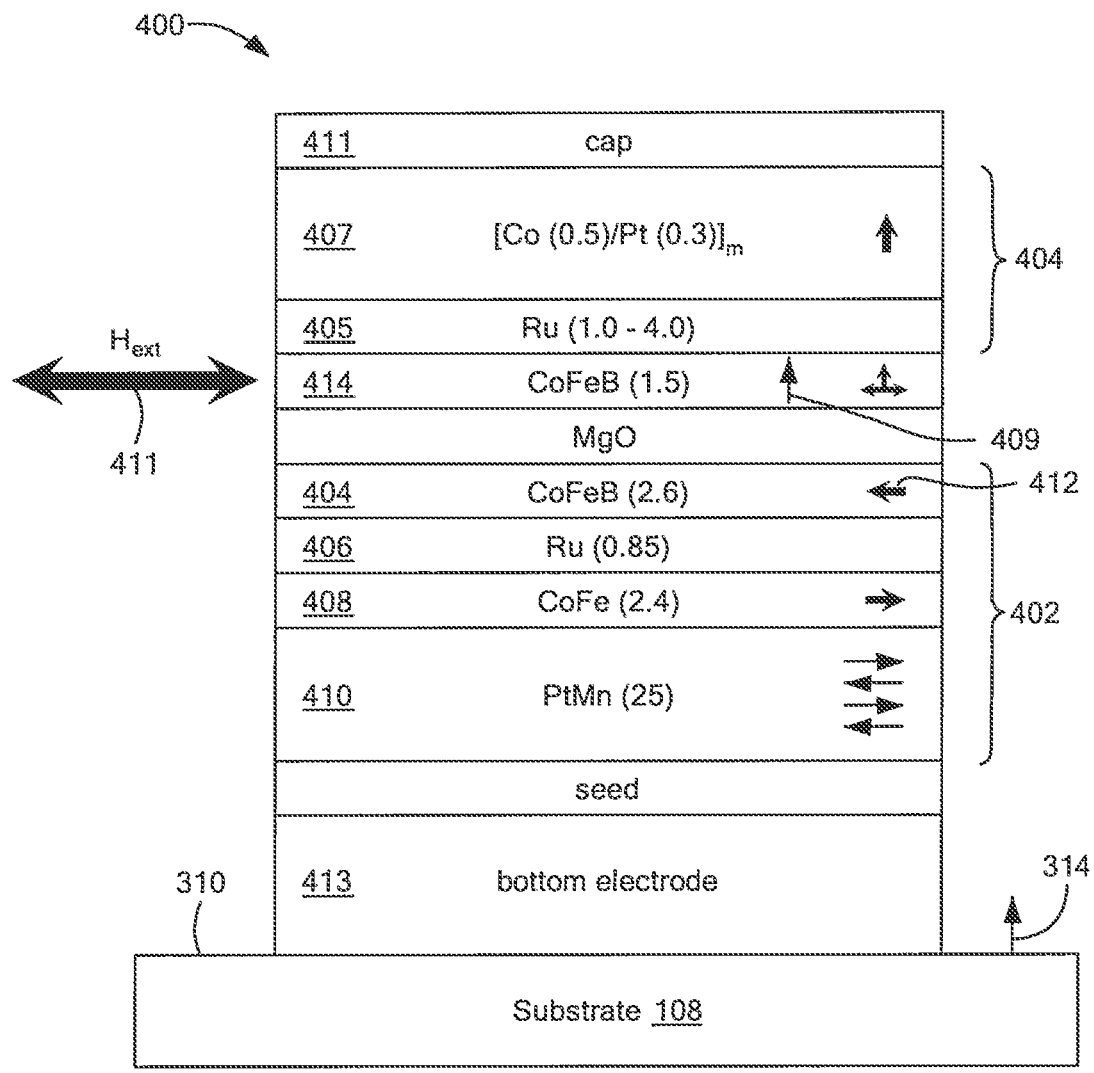
FIG. 4 is a block diagram of a double pinned in-plane tunnel magnetoresistance element with orthogonal bias and reference directions.

FIG. 4 is a block diagram of a tunneling giant MR (magnetoresistance) element 400 having a reference stack 402 with a magnetic alignment parallel to surface 310 of substrate 108 (i.e. perpendicular to normal vector 314). MR element 400 also has a bias stack 404 configured to bias free layer 406 in a direction perpendicular to surface 310 (i.e. parallel to normal vector 314) in the absence of an external magnetic field.

Bias stack 404 includes a spacer layer 405 and a pinning layer 407. Spacer layer 405 may comprise a selected material with a thickness chosen to create a relatively weak ferromagnetic or antiferromagnetic coupling between pinning layer 407 and free layer 414. The coupling may be strong enough to cause the magnetic alignment of free layer 414 to be biased in a direction parallel to and in the same direction as normal vector 314 in the absence of a magnetic field (as shown by arrow 409). The coupling may also be relatively weak so that the magnetic alignment of free layer 414 changes in response to external magnetic field 411.

Reference stack 402 includes pinning layer 410 having multiple internal layers (or crystal structures) with opposing magnetic directions. Pinned layer 410 may define or "pin" the magnetic alignment of layers 404-408.

Ferromagnetic layer 404, spacer layer 406, and ferromagnetic layer 408 may form a synthetic antiferromagnetic (SAF) structure having a magnetic alignment perpendicular to and in the same direction as normal vector 314, as illustrated by arrow 412. The electrical resistance of MR element 400 may be defined by the relative magnetic alignment of free layer 414 and ferromagnetic layer 404. Thus, when free layer 414 is aligned in the same direction as arrow 412, MR element 400 has a small electrical resistance. Conversely, when free layer 414 is aligned in the opposite direction to arrow 414 (e.g. to the right of the page), MR element 400 may have a large electrical resistance.

MR element 400 may be sensitive to magnetic fields like magnetic field 411 that are perpendicular to normal vector 314. For example, magnetic fields that are perpendicular to normal vector 314 may case the magnetic alignment of free layer 414 to change, and thus change the electrical resistance of MR element 400.

The TMR element 400 can be driven with a current that flows between the bottom electrode 413 and the cap 411. The TMR element 400 can be responsive to external magnetic fields in a direction of an arrow labeled Hext.

Figure 5:
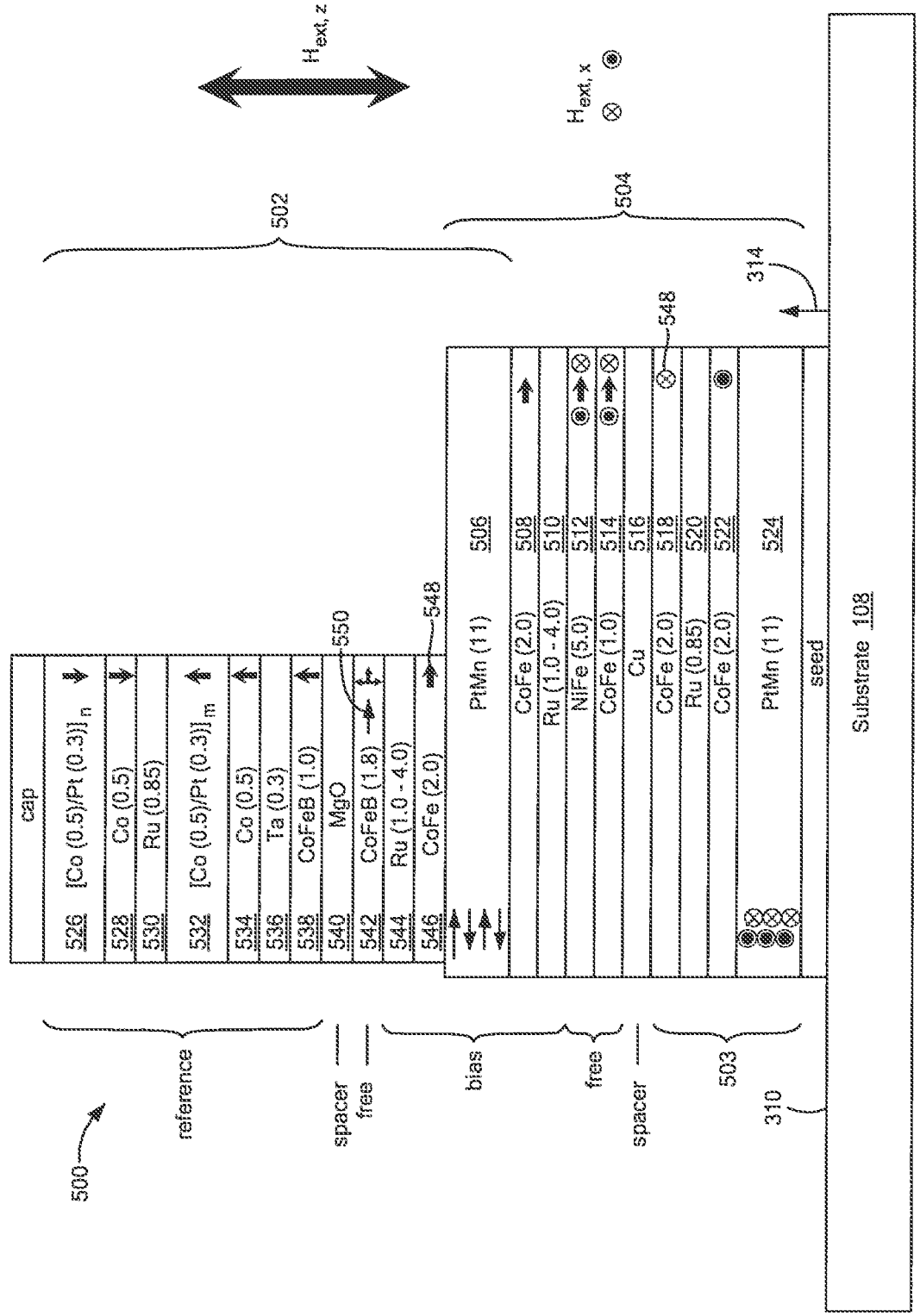
FIG. 5 is a block diagram of a stack comprising a TMR element disposed over a GMR element.

FIG. 5 is a block diagram of an MR stack 500 comprising a first MR element 502 (A TMR element) stacked on top of a second MR element 504 (a GMR element). In this example, MR element 502 has an axis of maximum sensitivity that is substantially perpendicular to the axis of maximum sensitivity of MR element 504. Also, in this example, MR element 502 is a TMR element with an axis if maximum sensitivity parallel to normal vector 314 and MR element 504 is a GMR element with an axis of maximum sensitivity perpendicular to normal vector 314.

In embodiments, MR element 504 has a width in a direction parallel to surface 310 greater than the width of MR element 502.

In embodiments, MR elements 502 and 504 may share one or more layers. In the example shown, MR elements 502 and 504 share pinning layer 506, which may be included in a bias stack in both MR element 502 and MR element 504.

GMR element 504 is configured to have an axis of maximum sensitivity parallel to surface 310 (i.e. perpendicular to normal vector 314). GMR element 504 includes a free layer structure comprising layers 512 and 514, reference stack 503 comprising layers 518-524 and having a fixed reference magnetic alignment, a bias stack comprising layers 506-510 to bias the magnetic alignment of free layers 512 and 514 in the absence of an external magnetic field, and spacer layer 516.

Reference stack 503 includes pinning layer 524 which has multiple, internal layers (or crystal structures) with opposing magnetic alignment. Reference stack 503 also includes an SAF (synthetic antiferromagnet) structure comprising layers 518-522. Pinning layer 524 pins the magnetic alignment of the SAF layers in place to provide a reference magnetic alignment. In this case, layer 518 has a magnetic alignment perpendicular to normal vector 314 and coming out of the page, as illustrated by symbol 548. Thus, when the magnetic alignment of free layers 512 and 514 is in the same direction as symbol 548 (i.e. coming out of the page), GMR element 504 will have a small resistance. When the magnetic alignment of free layers 512 and 514 is in the opposite direction (i.e. going into the page), GMR element 504 will have a large resistance.

As indicated by the symbols shown on each layer, the magnetic alignment of layers 512 and 514 may be into the page (indicated by the dot) or out of the page (indicated by the x) and may rotate between these two alignments in the presence of an external field. The arrow to the right indicates a default magnetic alignment when an external magnetic field is not present.

The GMR element's bias stack, comprising layers 506-510, causes free layers 512 and 514 to adopt a magnetic alignment parallel to that of pinned layer 508 in the absence of an external magnetic field.

TMR element 502 is configured to have an axis of maximum sensitivity perpendicular to surface 310 (i.e. parallel to normal vector 314). TMR element 502 includes a bias stack comprising at least layers 506, 544, and 546; a reference stack comprising layers 526-538; a spacer (insulator) layer 540 and a free layer 542. The reference stack includes a pinning layer 526 and a SAF structure comprising layers 528-532. The pinning layer 526 pins the magnetic alignment of the SAF structure in a direction parallel to normal vector 314. Layers 534-538 form a SAF structure.

TMR element 502 bias structure includes shared pinning layer 506. Pinning layer 506 pins the magnetic alignment of pinned layer 546 in a direction perpendicular to normal vector 314, as shown by arrow 548.

Antiferromagnetic coupling across spacer layer 544 between pinned layer 546 and free layer 542 cause the magnetic alignment of free layer 542 to adopt a direction perpendicular to normal vector 314, e.g. parallel (antiparallel) of the arrow 550, in the absence of an external magnetic field. The Ru spacer layer may be ferromagnetic or antiferromagnetic coupling depending on thickness of the Ru spacer layer.

MR stack 500 may be able to detect a magnetic field in two dimensions. As a magnetic target moves and rotates, its magnetic field vector will also move and rotate. In embodiments, its magnetic field vector can be broken down into a horizontal component Hext,x and a vertical component Hext,z. The horizontal component may affect the resistance of GMR element 504 and the vertical component may affect the resistance of TMR element 502. The change in resistances can be monitored by an external circuit or processor (not shown) to determine the state of the magnetic target in relation to the MR elements. Because the two MR elements are sensitive in different directions, a circuit monitoring the resistances of the MR elements may determine position of the target in at least two coordinates (e.g. the horizontal and vertical coordinates shown in FIG. 5).

Figure 6:
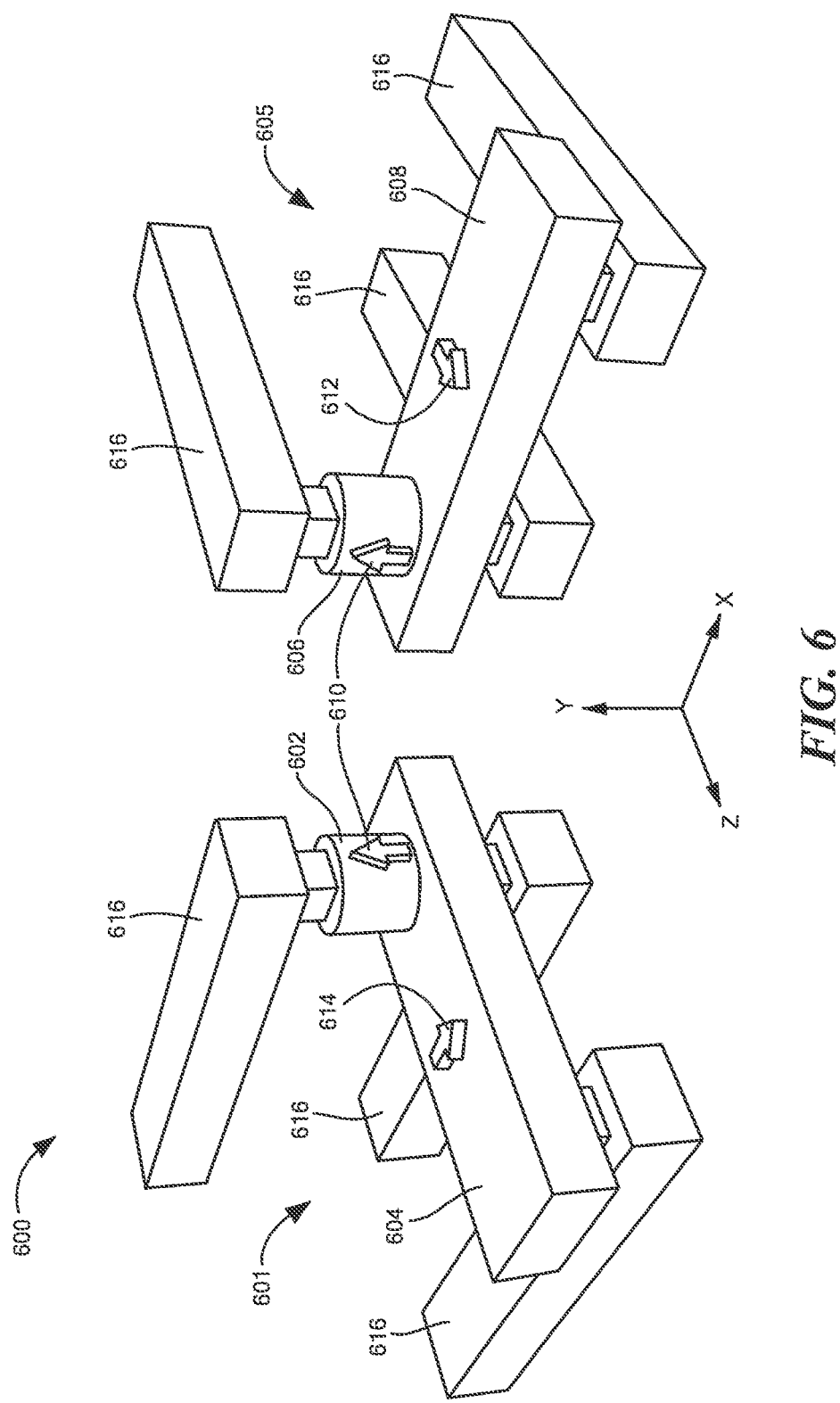
FIG. 6 is an isometric diagram of magnetoresistance elements positioned to detect a magnetic field in three dimensions.

Referring to FIG. 6, additional MR elements may be used to detect a target in three dimensions. In example system 600, two stacked TMR/GMR structures may be used. The first structure 601 comprises TMR element 602 stacked on top of GMR element 604. The second structure 605 comprises TMR element 606 stacked on top of GMR element 608.

Assuming a three-dimensional cartesian coordinate system with X, Y, and Z axes, TMR elements 602 and 606 may be sensitive to magnetic fields in the Y direction as shown by arrows 610. Structure 605 may be positioned so that GMR element 608 is sensitive to magnetic fields in the Z direction (substantially orthogonal to arrows 610), as shown by arrow 612. Structure 601 may be positioned so that GMR element 604 is sensitive to magnetic fields in the X direction (substantially orthogonal to arrows 610 and 612), as shown by arrow 614. If incorporated into a magnetic field sensor, structures 601 and 605 will provide magnetic information in three dimensions. Metal traces 616 (i.e., within metal layers) may provide electrical connections to TMR elements 602 and 606, and GMR elements 604 and 608 for interconnection to external circuits.

Referring to FIG. 7, a dual MR element stack 700 (here a dual GMR element stack, but alternatively, a dual TMR element stack described below) comprises a first single-pinned magnetoresistance (MR) element 701 having layers 702-714 and a second single-pinned magnetoresistance element 715 having layers 718-730. MR element 701 and MR element 715 may be separated by a thick insulating layer 716, which results in the MR elements 701, 715 essentially being electrically different MR elements that act independently. Both of the MR elements 701, 715 are responsive to magnetic fields that have direction components parallel to a surface 732a of a substrate 732 upon which the dual MR element stack 700 is formed.

In embodiments, MR element 701 has reference pinned layer 704 with a first reference direction (shown by arrow 734) and MR element 715 has a reference pinned layer 722 with a magnetic direction (shown by arrow 736) that is not the same as the direction of reference pinned layer 704, each of which being proximate to a respective Cu spacer layer 720, 703. As a result of the different magnetic directions of the reference pinned layers 722, 704 proximate to the Cu spacer layers 720, 703, MR element 701 and MR element 715 have opposite responses to an external magnetic field. For example, if an external magnetic field increases in the direction of arrow 734, the resistance of MR element 701 may decrease while the resistance of MR element 715 may increase, or vice versa.

To produce opposite magnetic directions, MR element 715 and MR element 701 can have different structures described below.

MR element 715 may have a reference antiferromagnetic pinning layer 728 magnetically coupled to a single SAF 717 (synthetic antiferromagnet) reference pinned layer structure (comprising layers 722-726). Ferromagnetic pinned layer 726 can have a magnetic direction to the right and reference ferromagnetic pinned layer 722 can have a magnetic direction to the left, and proximate to Cu spacer layer 720.

A selected thickness and material of spacer layer 724 can result in the antiferromagnetic coupling between ferromagnetic pinned layer 726 and reference ferromagnetic pinned layer 722. In other embodiments, a different thickness or material of the spacer layer 724 can result in ferromagnetic coupling, for which magnetic directions of the ferromagnetic pinned layer 726 and reference ferromagnetic pinned layer 722 can be the same, e.g., to the right.

In contrast, MR element 701 may have a reference antiferromagnetic pinning layer 714 magnetically coupled to a double SAF 719 reference pinned layer structure (comprising layers 704-712). Ferromagnetic pinned layer 712 can have a magnetic direction to the right, ferromagnetic pinned layer 708 can have a magnetic direction to the left, and reference ferromagnetic pinned layer 704 can have a magnetic direction to the right and proximate to Cu spacer layer 703. A selected thickness and material of the spacer layers 710, 706 can result in the antiferromagnetic coupling between ferromagnetic pinned layer 712 and ferromagnetic pinned layer 708 and also between ferromagnetic pinned layer 708 and reference ferromagnetic pinned layer 704. In other embodiments, a different thickness or material of the spacer layer 710 and/or spacer layer 706 can result in ferromagnetic coupling between respective layers.

It will be understood that maximum response axes of the MR elements 701, 715 are parallel to magnetic directions within the reference ferromagnetic pinned layers 704, 722, respectively. Furthermore, responses of the MR elements 701, 715 to an external magnetic field are in opposite directions due to the opposite magnetic directions within the reference ferromagnetic pinned layers 704, 722 most proximate to the spacer layers 703, 720. This arrangement may have advantage when the MR elements 701, 715 are used in a bridge arrangement discussed below in conjunction with FIG. 9.

MR element 715 may also include a free layer structure 718. Likewise, MR element 701 may include a free layer structure 702 and Cu spacer layer 703. As is known, magnetic directions of the free layers can move in response to an external magnetic field.

As shown, dual MR element stack 700 may be supported by substrate 732, which may be a semiconductor substrate made from a semiconductor material such as silicon, a semiconductor ceramic, a semiconductor polymer; etc.

Stack 700 may also include seed layer 730 and cap layer 705, which may be a protective layer to physically protect stack 700 from damage.

In embodiments, the free layer structures 702 and 718 may be formed as bilayers 718a, 718b and 702a, 702b of CoFe and NiFe. Ferromagnetic layers 704, 708, 712, and 726 may be formed from CoFe, spacer layers 706, 710, and 724 may be formed from Ru, and antiferromagnetic layers 714 and 728 may be formed from PtMn or IrMn. As shown, the Ru spacer layers may have a thickness of about 0.85 nm.

In other embodiments, the single SAF 717 can be replaced with a single reference ferromagnetic pinned layer and the double SAF 719 can be replaced with a single SAF. In these embodiments, reference pinned layers proximate to the Cu spacer layers 703, 720 can also be in opposite direction, resulting in opposite response to magnetic field as desired.

In other embodiments, additional layers can be provided directly above the free layer 718 and/or above the free layer 702, for example, to make each one of the single pinned MR elements 715, 701 into double pinned MR elements.

In other embodiments, the dual MR element stack 700 can instead be a dual TMR element stack, for example, by replacing the layers 722, 720, 718, 704, 703, 702 with other layers comprised of other materials and thicknesses. For example, the Cu spacer layers 720, 703 can be replaced by MgO tunnel barrier layers and the free layers 718, 702 can be replaced by other ferromagnetic materials, for example, CoFeB, to result in a dual TMR element stack.

In all embodiments above, the dual GMR or dual TMR element stacks provide two different MR elements that respond in different resistance change directions in response to an external magnetic field, and, in particular, to an external magnetic field that has some projected direction component parallel to the magnetic directions of the reference ferromagnetic pinned layers 722, 704. This characteristic may be important when the dual MR elements are used in a bridge arrangement for reasons that become apparent in conjunction with FIG. 8 below.

It should be apparent that forming a dual MR element stack upon a substrate is much easier than forming two separate MR element stacks, particularly when the two MR element stacks have different layers as described above. With the dual MR element stack 700, the different layers can be deposited sequentially in any order.

The two reference pinning layers 728, 714 have resulting magnetic influence on the pinned layers 726, 712 in the same direction. Thus, it should be appreciated that the two different response directions of the GMR elements 701, 715 are achieved in one annealing step forming the two GMR elements 701, 715. No repining (e.g., by laser repining) of one of the reference pinning layers 728, 714 to a different direction is required to achieve the two different response directions.

Figure 8:
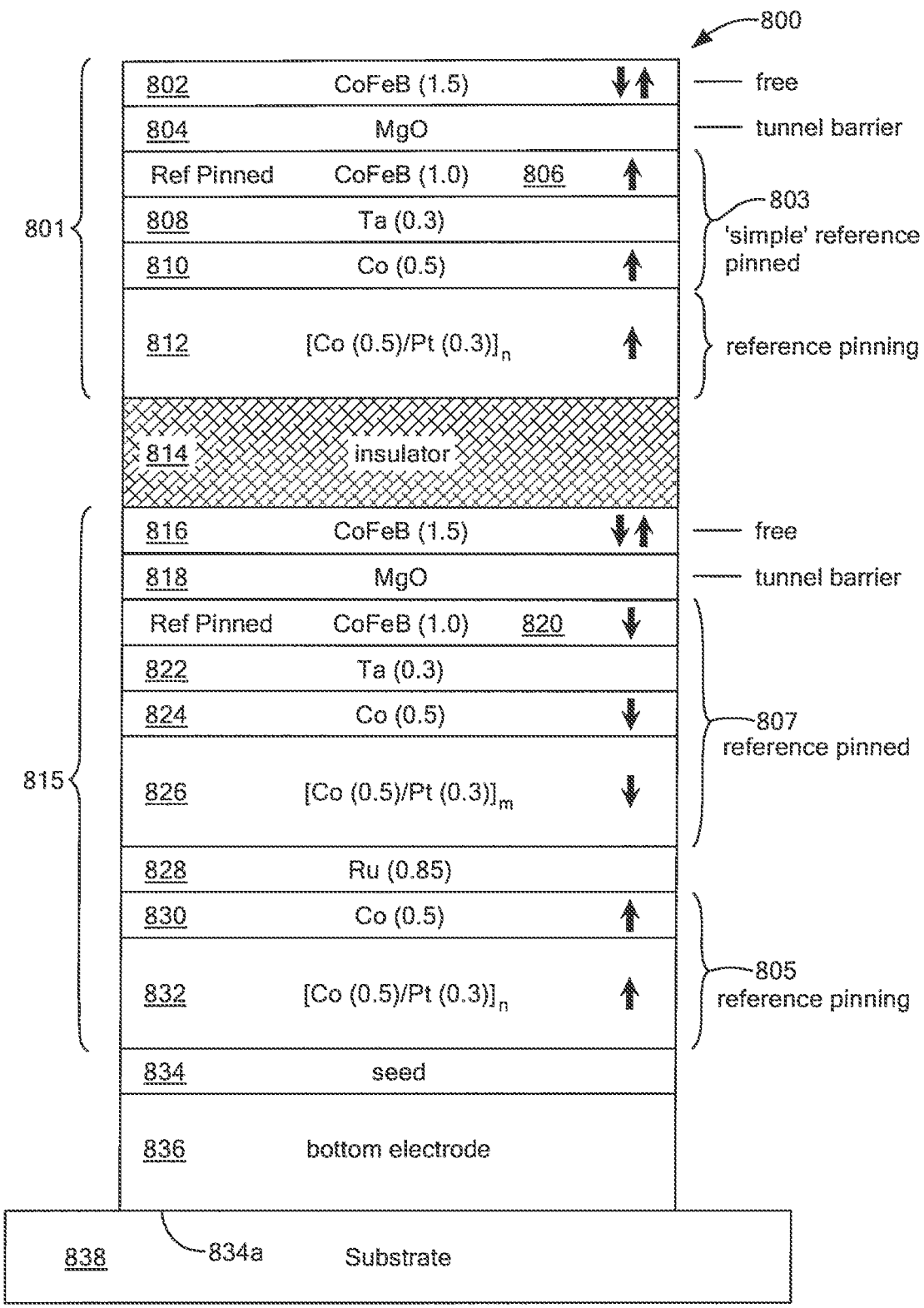
FIG. 8 is a block diagram of another illustrative dual MR element stack with a top and a bottom MR element.

Referring now to FIG. 8, a dual TMR element stack 800 can include a TMR element 801 disposed under a TMR element 815 and separated by an insulator layer 814. The TMR element 801 and the TMR element 815 act essentially independently. Unlike the dual GMR element stack 700 (or TMR element stack) of FIG. 7, the dual TMR element stack 800 is responsive to external magnetic fields that have a direction component perpendicular to a surface 834a of a substrate 834. The TMR element 815 having layers 812-832, can be the same as or similar to the TMR element 100 of FIG. 1, but excludes the cap layer 111.

Thicknesses are shown in units of nm. The MgO layers 818, 804 can have thicknesses in the range of about 0.1 nm to 6.0 nm. The TMR element 815 includes a reference pinning layer structure 805 comprised of layers 832, 830. The TMR element 815 can also include a reference pinned layer structure 807 having layers 820-826.

It should be understood that the reference pinned layer structure 807 together with the reference pinning layer structure 805 separated by a spacer layer 828 provides a SAF arrangement determined by a thickness and material of spacer layer 828. Antiferromagnetic coupling occurs across the Ru layer 828 having a thickness of about 0.85 nm. In other embodiments, the spacer layers 828 can have a different thickness and/or be comprised of a different material to result in ferromagnetic coupling across the spacer layer 828.

A magnetic response (of resistance) direction of the TMR element 815 is determined according to a magnetic direction of reference pinned layer 820 most proximate to tunnel barrier layer 818.

In contrast, the TMR element 801 can include a reference pinning layer 812 magnetically coupled to a reference pinned layer structure 803 comprised of layers 806, 808, 810. The reference pinned layer structure 803 can have ferromagnetic coupling from reference pinning layer 812 to pinned layer 810, across spacer layer 808, to reference pinned layer 806. Thus, the TMR element 801 has only a simple reference pinned layer structure 803, without a SAF, e.g., without any antiferromagnetic coupling between layers. Reference pinned layer 806, most proximate to tunnel barrier layer 804, has a magnetic direction opposite to a magnetic direction of reference pinned layer 820. Thus, the TMR element 801 responds (resistance change) in an opposite way to an external magnetic field than does the TMR element 815.

A magnetic response (of resistance) direction of the TMR element 801 is determined according to a magnetic direction of reference pinned layer 806, which is opposite to a direction of the reference pinned layer 820.

As used herein, the term "variable resistance layer" is used to describe a layer that is most influenced by magnetic field directions of surrounding layers, e.g., free layers, to change resistance in an MR element. Thus, referring, for example too FIGS. 7 and 8 above, layers 720, 703, 818, and 804 are variable-resistance layers. Magnetic directions of reference pinned layers 722, 704, 820, 806 most proximate to the variable resistance layers 720, 703, 818, 804, respectively, determine a direction of maximum positive response of the MR elements 701, 715, 801, 815, respectively.

The dual TMR element 800 can be comprised of other stacks of layers, illustrated, for example, in conjunction with FIGS. 1-5, such that associated reference pinned layers have magnetic directions that are in opposite direction.

In some embodiments, the dual GMR element 700 is disposed under or over the dual TMR element 800 in a way similar to that described in conjunction with FIGS. 5 and 6. Like the arrangements of FIGS. 5 and 6, such an arrangement can provide a multi-axis magnetic field sensing element.

The two reference pinning layers 828, 812 have resulting magnetic influence on the pinned layers 826, 810 in the same direction. Thus, it should be appreciated that the two different response directions of the TMR elements 801, 815 are achieved in one annealing step forming the two TMR elements 801, 815. No repining (e.g., by laser repining) of one of the reference pinning layers 828, 812 to a different direction is required to achieve the two different response directions.

Figure 9:
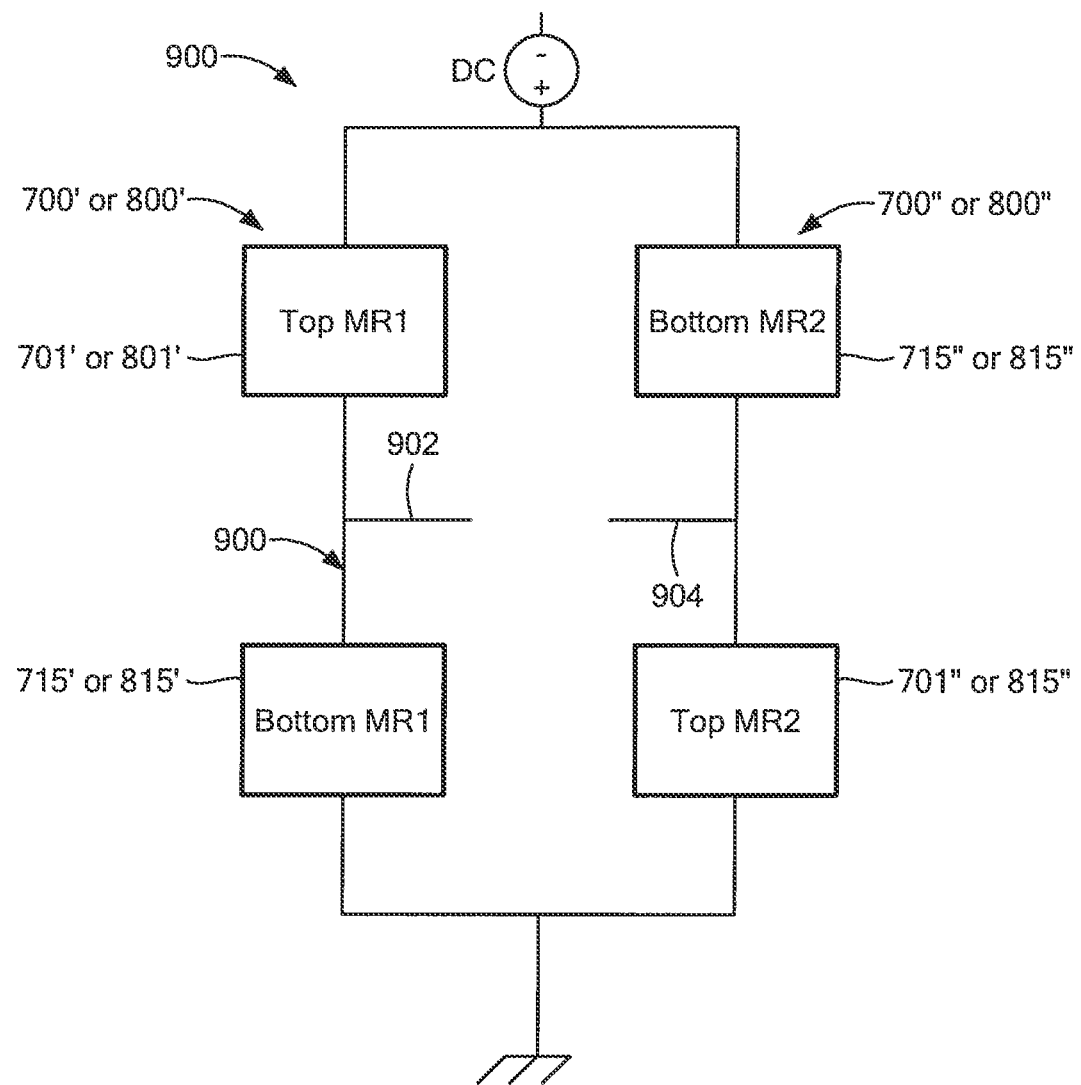
FIG. 9 is a circuit diagram of a bridge circuit comprising two of the dual MR element stacks shown in FIG. 7 or 8.

Referring to FIG. 9, a bridge circuit 900 for detecting a magnetic field may be formed from two dual MR stacks 700', 700", (or 800', 800") each of which may be the same or similar to dual MR element stack 700 (or 800). Dual MR element stack 700' (or 800') may include an MR element 701' (or 801'), which may be the same as or similar to MR element 701 (or 801) and an MR element 715' which may be the same as or similar to MR element 715. (or 815). Dual MR element stack 700" (or 800") may include an MR element 701" (or 801"), which may also be the same as or similar to MR element 701 (or 801), and an MR element 715" (or 815"), which may also be the same as or similar to MR element 715 (or 815). Thus, the bridge arrangement has two dual MR element stacks, resulting in four separate MR elements.

From the bridge 900, it should be apparent, that in order to achieve a differential signal 802, 804, MR element 701' (or 801') should increase in resistance and MR element 715' (or 815') should decrease in resistance, or vice versa, in response to an external magnetic field. Similarly, MR element 715" (or 815") should decrease in resistance and MR element 701" (or 810") should increase in resistance, or vice versa, in response to the external magnetic field. For this reason, the dual MR element stack has two MR element stacks, each of which has two MR elements that respond in opposite directions to an external magnetic field.

This arrangement creates a differential signal 902, 904 in response to the external magnetic field. In contrast, if all of the GMR elements 701', 701", 715', 715" (or 801', 801", 815", 815") responded in the same way to an external magnetic field, then there would be no differential signal 902, 904, since both individual signals 902, 904 would change voltage in the same direction in response to an external magnetic field.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that the scope of the patent should not be limited to the described embodiments but rather should be limited only by the spirit and scope of the following claims. All references cited herein are hereby incorporated herein by reference in their entirety.

The invention claimed is:

1. An electronic circuit, comprising:
   a first magnetoresistance element, comprising:
     a first reference pinning layer having a first magnetic direction;
     a first variable resistance layer; and
     a first reference pinned layer disposed between the first reference pinning layer and the first variable resistance layer and proximate to the first variable-resistance layer, the first reference pinned layer having the first magnetic direction, the electronic circuit further comprising:
   a second magnetoresistance element disposed under or over the first magnetoresistance element, comprising:
     a second reference pinning layer having the first magnetic direction;
     a second variable-resistance layer; and
     a second reference pinned layer disposed between the second reference pinning layer and the second variable resistance layer and proximate to the second variable-resistance layer, the second reference pinned layer having a second magnetic direction opposite to the first magnetic direction, resulting in the first and second magnetoresistance elements having opposite responses to an external magnetic field.

2. The electronic circuit of claim 1, further comprising:
a first insulator layer disposed between the first and second magnetoresistance elements.

3. The electronic circuit of claim 2, wherein the first magnetoresistance element comprises:
a single synthetic antiferromagnetic (SAF) structure having the first reference pinned layer, wherein the second magnetoresistance element comprises:
a double synthetic antiferromagnetic (SAF) structure having the second reference pinned layer.

4. The electronic circuit of claim 3, wherein the double synthetic antiferromagnetic (SAF) structure comprises:
first, second, and third ferromagnetic layers, the third ferromagnetic layer being the first reference pinned layer;
a first spacer layer disposed between the first and second ferromagnetic layers, the first spacer layer having a thickness and a material selected to result in antiferromagnetic coupling between the first and second ferromagnetic layers; and
a second spacer layer disposed between the second and third antiferromagnetic layers, the second spacer layer having a thickness and a material selected to result in antiferromagnetic coupling between the first and second ferromagnetic layers to result in the first and third ferromagnetic layers having the same internal magnetic direction.

5. The electronic circuit of claim 3, wherein the single synthetic antiferromagnetic (SAF) structure comprises fourth and fifth ferromagnetic layers, the fifth ferromagnetic layer being the second pinned reference layer; and
a third spacer layer disposed between the fourth and fifth ferromagnetic layers, the third spacer layer having a thickness and a material selected to result in antiferromagnetic coupling between the fourth and fifth ferromagnetic layers.

6. The electronic circuit of claim 3, further comprising:
a first free layer structure disposed proximate to the first reference pinned layer structure; and
a second free layer structure disposed proximate to the second reference pinned layer structure; wherein, in the absence of an external magnetic field, the first and second free layer structures have opposite directions of internal magnetic fields, resulting in the first and second magnetoresistance elements having opposite directions of response to the external magnetic field.

7. The electronic circuit of claim 3, wherein the first and second magnetoresistance elements are coupled together in a half bridge arrangement.

8. The electronic circuit of claim 3, wherein the first and second magnetoresistance elements are Giant Magnetoresistance (GMR) elements.

9. The electronic circuit of claim 3, wherein the first and second magnetoresistance elements are Tunneling Magnetoresistance (TMR) elements.

10. The electronic circuit of claim 3, wherein the first and second magnetoresistance elements are TMR elements that have maximum response axes perpendicular to a substrate on which the first and second magnetoresistance elements are formed.

11. The electronic circuit of claim 2, wherein the first magnetoresistance element comprises:
a pinned layer structure having the first reference pinned layer, wherein the second magnetoresistance element comprises:
a single synthetic antiferromagnetic (SAF) structure having the second reference pinned layer.

12. The electronic circuit of claim 11, wherein the pinned layer structure comprises:
the first reference pinned layer.

13. The electronic circuit of claim 11, wherein the single synthetic antiferromagnetic (SAF) structure comprises first and second ferromagnetic layers, the first ferromagnetic layer being the second pinned reference layer; and
a spacer layer disposed between the first and second ferromagnetic layers, the spacer layer having a thickness and a material selected to result in antiferromagnetic coupling between the first and second ferromagnetic layers.

14. The electronic circuit of claim 11, further comprising:
a first free layer structure disposed proximate to the first reference pinned layer structure; and
a second free layer structure disposed proximate to the second reference pinned layer structure; wherein, in the absence of an external magnetic field, the first and second free layer structures have opposite directions of internal magnetic fields, resulting in the first and second magnetoresistance elements having opposite directions of response to the external magnetic field.

15. The electronic circuit of claim 11, wherein the first and second magnetoresistance elements are coupled together in a half bridge arrangement.

16. The electronic circuit of claim 11, wherein the first and second magnetoresistance elements are GMR elements.

17. The electronic circuit of claim 11, wherein the first and second magnetoresistance elements are TMR elements.

18. The electronic circuit of claim 11, wherein the first and second magnetoresistance elements are TMR elements that have maximum response axes perpendicular to a substrate on which the first and second magnetoresistance elements are formed.

19. The electronic circuit of claim 11, further comprising:
a third magnetoresistance element, comprising:
a third reference pinning layer having a third magnetic direction;
a third variable-resistance layer; and
a third reference pinned layer disposed between the third reference pinning layer and the third variable-resistance layer and proximate to the third variable-resistance layer, the third reference pinned layer having the third magnetic direction, the electronic circuit further comprising:
a fourth magnetoresistance element disposed under or over the third magnetoresistance element, comprising:
a fourth reference pinning layer having a fourth magnetic direction,
a fourth variable-resistance layer; and
a fourth reference pinned layer disposed between the fourth reference pinning layer and the fourth variable-resistance layer and proximate to the fourth variable-resistance layer, the fourth reference pinned layer having a fourth magnetic direction opposite to the third magnetic direction, resulting in the third and fourth magnetoresistance elements having opposite responses to an external magnetic field, the electronic circuit further comprising:
a second insulator layer disposed between the second and third magnetoresistance elements; and
a third insulator layer disposed between the third and fourth magnetoresistance elements.

20. The electronic circuit of claim 19, wherein the first, second, third and fourth magnetoresistance elements are GMR elements.

21. The electronic circuit of claim 19, wherein the first, second, third and fourth magnetoresistance elements are TMR elements.

22. The electronic circuit of claim 19, wherein the first and second magnetoresistance elements are GMR elements and wherein the third and fourth magnetoresistance elements are TMR elements.

23. The electronic circuit of claim 19, wherein the first and second magnetoresistance elements are GMR elements that have maximum response axes parallel to a substrate on which the first and second magnetoresistance elements are formed, and wherein the third and fourth magnetoresistance elements are TMR elements that have maximum response axes perpendicular to the substrate on which the third and fourth magnetoresistance elements are formed.

24. An electronic circuit, comprising:
a first magnetoresistance element, comprising:
a first single synthetic antiferromagnet (SAF) reference pinned layer structure having a first one and only one spacer layer having a material and a thickness to result in antiferromagnetic coupling across the first one and only one spacer layer;
a second magnetoresistance element disposed under or over the first magnetoresistance element, comprising:
a first double synthetic antiferromagnet (SAF) reference pinned layer structure having a first two and only two spacer layers, each having a respective material and a respective thickness to result in antiferromagnetic coupling across each one of the first two and only two spacer layers, the first signal synthetic antiferromagnet (SAF) resulting in the first magnetoresistance element having a first resistance change in a first direction and the first double synthetic antiferromagnet (SAF) resulting in the second magnetoresistance element having a second resistance change in a second direction opposite to the first direction in response to an external magnetic field, the electronic circuit further comprising:
a first insulator layer disposed between the first and second magnetoresistance elements.

25. The electronic circuit of claim 24, wherein the first and second magnetoresistance elements are coupled together in a half bridge arrangement.

26. The electronic circuit of claim 24, wherein the first and second magnetoresistance elements are Giant Magnetoresistance (GMR) elements.

27. The electronic circuit of claim 24, wherein the first and second magnetoresistance elements are Tunneling Magnetoresistance (TMR) elements.

28. The electronic circuit of claim 24, wherein the first and second magnetoresistance elements are TMR elements that have maximum response axes perpendicular to a substrate on which the first and second magnetoresistance elements are formed.

29. The electronic circuit of claim 24, further comprising:
a third magnetoresistance element, comprising:
a second single synthetic antiferromagnet (SAF) reference pinned layer structure having a second one and only one spacer layer having a material and a thickness to result in antiferromagnetic coupling across the second one and only one spacer layer;
a fourth magnetoresistance element disposed under or over the third magnetoresistance element, comprising:
a second double synthetic antiferromagnet (SAF) reference pinned layer structure having a second two and only two spacer layers, each having a respective material and a respective thickness to result in antiferromagnetic coupling across each one of the second two and only two spacer layers, the second signal synthetic antiferromagnet (SAF) resulting in the third magnetoresistance element having a third resistance change in a third direction and the second double synthetic antiferromagnet (SAF) resulting in the fourth magnetoresistance element having a fourth resistance change in a fourth direction opposite to the third direction in response to an external magnetic field, the electronic circuit further comprising:
a second insulator layer disposed between the second and third magnetoresistance elements; and
a third insulator layer disposed between the third and fourth magnetoresistance elements.

30. The electronic circuit of claim 29, wherein the first, second, third and fourth magnetoresistance elements are GMR elements.

31. The electronic circuit of claim 29, wherein the first, second, third and fourth magnetoresistance elements are TMR elements.

32. The electronic circuit of claim 29, wherein the first and second magnetoresistance elements are GMR elements and wherein the third and fourth magnetoresistance elements are TMR elements.

33. The electronic circuit of claim 29, wherein the first and second magnetoresistance elements are GMR elements that have maximum response axes parallel to a substrate on which the first and second magnetoresistance elements are formed, and wherein the third and fourth magnetoresistance elements are TMR elements that have maximum response axes perpendicular to the substrate on which the third and fourth magnetoresistance elements are formed.

* * * * *

UNITED STATES PATENT AND TRADEMARK OFFICE
CERTIFICATE OF CORRECTION

PATENT NO. : 10,734,443 B2
APPLICATION NO. : 16/507538
DATED : August 4, 2020
INVENTOR(S) : Rémy Lassalle-Balier et al.

Page 1 of 1

It is certified that error appears in the above-identified patent and that said Letters Patent is hereby corrected as shown below:

In the Specification

Column 1, Line 54, delete "magnetoresistance" and replace with --magnetoresistance elements--.

Column 1, Line 61, delete "magnetoresistance" and replace with --magnetoresistance elements--.

Column 2, Line 67, delete "GMR" and replace with --giant magnetoresistance (GMR)--.

Column 3, Line 4, delete "MR" and replace with --magnetoresistance (MR)--.

Column 7, Line 9, delete "(A TMR" and replace with --(a TMR--.

Column 11, Line 62, delete "No repining (e.g., by laser repining)" and replace with --No repinning (e.g., by laser repinning)--.

In the Claims

Column 15, Line 2, delete "third" and replace with --third,--.

Signed and Sealed this
Twenty-second Day of December, 2020

Andrei Iancu
*Director of the United States Patent and Trademark Office*